(12) United States Patent
Lin

(10) Patent No.: US 7,381,597 B2
(45) Date of Patent: Jun. 3, 2008

(54) METHOD FOR FABRICATING A THIN-FILM TRANSISTOR

(75) Inventor: Han-Tu Lin, Taichung County (TW)

(73) Assignee: AU Optronics Corp., Hsin-Chu (TW)

( * ) Notice: Subject to any disclaimer, the term of this patent is extended or adjusted under 35 U.S.C. 154(b) by 151 days.

(21) Appl. No.: 11/466,446

(22) Filed: Aug. 22, 2006

(65) Prior Publication Data

US 2007/0249104 A1     Oct. 25, 2007

(30) Foreign Application Priority Data

Apr. 24, 2006   (TW) ................................. 95114536 A

(51) Int. Cl.
    *H01L 21/00* (2006.01)
(52) U.S. Cl. ..................... 438/151; 257/59; 257/72; 257/347
(58) Field of Classification Search .............. 438/5; 257/59, 72, 347
    See application file for complete search history.

(56) References Cited

U.S. PATENT DOCUMENTS

| 4,684,435 | A | 8/1987 | Kishi et al. |
| 6,998,640 | B2 | 2/2006 | Wang et al. |
| 2004/0063254 | A1 | 4/2004 | Wang |
| 2006/0097260 | A1 | 5/2006 | Huang |

*Primary Examiner*—Ha Nguyen
*Assistant Examiner*—Chakila Tillie
(74) *Attorney, Agent, or Firm*—Winston Hsu

(57) ABSTRACT

A method for fabricating a thin-film transistor contains successively forming four thin films on a substrate and performing an etching process to pattern the four thin films, wherein the four thin films are a first conductive layer, a first insulation layer, a semiconductor film, and a metal-containing sacrificial layer from bottom to top. A second insulation layer is formed on the substrate and the metal-containing sacrificial layer. Then, a lift-off process is performed to the metal-containing sacrificial layer for simultaneously removing the metal-containing sacrificial layer and the second insulation layer positioned on the metal-containing sacrificial layer. Finally, a second conductive layer is formed on the semiconductor layer for forming a source electrode and a drain electrode.

15 Claims, 15 Drawing Sheets

METHOD FOR FABRICATING A THIN-FILM TRANSISTOR

BACKGROUND OF THE INVENTION

1. Field of the Invention

The present invention relates to a method for fabricating thin-film transistors, and more particularly, to a method for fabricating thin-film transistors by a lift-off process.

2. Description of the Prior Art

Due to the continued development in technology, flat display panels have been widely used in various information products. Among the various types of flat display panels, thin-film transistor liquid crystal displays (TFT-LCDs) are developed maturely. Because TFT-LCDs have qualities of light weight, thinness, low energy requirements, and no radiation, they have been widely used in portable information products, such as notebooks and personal digital assist (PDA) computers, and even replaced the conventional traditional cathode ray tube (CRT) monitors gradually. The main electric elements of a TFT-LCD are thin-film transistors arranged as an array. In operation with appropriate capacitors and conducting pads, the thin-film transistors drive liquid crystal pixels for producing colorful images, and therefore a thin-film transistor is one of the key elements affecting the image quality of a TFT-LCD.

A thin-film transistor has a gate electrode, a source, a drain, and a semiconductor layer for forming a channel of the transistor. A typical fabrication process of a conventional thin-film transistor has to perform five photolithography processes, which means five photomasks need to be used for defining the patterns of the thin-film transistor. However, since the costs of photomask seriously affect the fabrication costs of display panels, a new fabrication process of thin-film transistors array by using four photomasks, including at least a half-tone mask, has been researched in order to reduce the fabrication costs.

With reference to FIGS. 1-4, FIGS. 1-4 are schematic diagrams of the fabrication process of a thin-film transistor by using four photomasks according to the prior art. As shown in FIG. 1, a first conductive layer and a photoresist layer are formed on the transparent substrate 10 in order. Then, a first photolithography-etching process (PEP) is performed to form a gate electrode 12 and a wire pattern 14.

As shown in FIG. 2, an insulation layer 16, a semiconductor layer 18, an ohmic contact layer 20, a second conductive layer 22, and a photoresist layer 24 are sequentially formed on the surface of the transparent substrate 10. Then, as shown in FIG. 3, a half-tone mask 26 is used to perform a second photolithography process for patterning the photoresist layer 24, wherein the half-tone region of the half-tone mask 26 corresponds to the predetermined channel region above the gate electrode 12.

Referring to FIG. 4, the patterned photoresist layer 24 is taken as an etching mask to sequentially perform a wet etching process and a dry etching process to the transparent substrate 10 for removing portions of the semiconductor layer 18, the ohmic contact layer 20, and the second conductive layer 22 so as to from a semiconductor island 32, a source 28, and a drain 30. Finally, several deposition processes and a third and a fourth PEP processes are performed to form a passivation layer and a pixel electrode electrically connecting to the drain 30 on the transparent substrate 10 so that the fabrication of the thin-film transistor and pixel electrode of each pixel or each sub-pixel is finished.

As mentioned above, the prior-art fabrication method of thin-film transistors uses the half-tone mask during the second PEP process by taking its half-tone region to define the channel pattern of the thin-film transistor. Because the size of the channel pattern of the thin-film transistor is very detailed and minute, the half-tone mask for defining the channel pattern by its half-tone region has to be very accurate, whose formation cost is very high and is twice as the formation cost of normal photomask. Therefore the process cost is very high by using the half-tone mask. In addition, once a defect of the transference of the channel pattern occurs during the second PEP by using a half-tone mask, it will seriously affect the electric property of the thin-film transistor, which is hard to be repaired. Furthermore, according to the prior-art process of fabricating a thin-film transistor, both of the source and drain patterns cover the semiconductor layer so that photo current is easily induced since most materials of the semiconductor layer are amorphous silicon materials that have photo sensitivity, and photo current affects the electrical performance of the thin-film transistor.

For solving the above-mentioned problem of photo current, Wang et al. provide an U.S. Pat. No. 6,998,640 to disclose another method for fabricating thin-film transistors with island-in structure. Referring to FIG. 5, Wang et al. teach forming a first conductive layer 210, an insulation layer 220, a semiconductor layer 230, an ohmic contact layer 240, and a photoresist layer 241 successively on the surface of the transparent substrate 200, and performing a photolithography-etching process to pattern the thin films. Then, as shown in FIG. 6, a chemical vapor deposition (CVD) process is performed to form an insulation layer on the whole transparent substrate 200 to cover the surface of the transparent substrate 200 for forming the passivation layer 250b and to cover the photoresist layer 241 for forming the passivation layer 250a. Finally, as shown in FIG. 7, a lift-off process to the photoresist layer 241 is performed with removing the passivation layer 250a simultaneously to complete the fabrication of the semiconductor island. Thereafter, other elements, such as the source and drain, may be formed on the surface of the semiconductor island to finish fabricating the thin-film transistor structure.

However, since general photoresist material will have solvent volatile issue when the temperature reaches 50° C., and will decompose when the temperature reaches 130° C. Furthermore, according to the process of the disclosure of Wang et al., the passivation layer 250a formed on the photoresist layer 241 is fabricated by a CVD process, and the process temperature of conventional CVD processes is more than 280° C. Therefore, when the transparent substrate 200 with the photoresist layer 241 thereon is transferred into the CVD chamber for forming the passivation layers 250a, 250b, the photoresist layer 241 easily decomposes to contaminate the CVD chamber. Accordingly, the patent of Wang et al. has the problem that it is not practicable in practical fabrication processes, and the method taught by Wang et al. cannot be applied to the manufacturers or mass productions of display panels.

As mentioned above, how to fabricate thin-film transistors by practicable processes with low costs to avoid the photo current problem is still an important issue for the manufactures.

SUMMARY OF THE INVENTION

It is therefore a primary objective of the present invention to provide a method for fabricating thin-film transistors through a lift-off process and utilizing a metal-containing sacrificial layer for solving the above-mentioned problems of high cost and photo current of the prior-art method for fabricating thin-film transistors.

According to the claimed invention, a method for fabricating a thin-film transistor is provided. First, four thin films are successively formed on a substrate, wherein the four thin films comprise a first conductive layer, a first insulation layer, a semiconductor layer, and a metal-containing sacrificial layer from bottom to top. An etching process is performed to pattern the four thin films simultaneously so as to make the first conductive layer form a gate electrode. Then, a second insulation layer is formed on the surfaces of the substrate and the metal-containing sacrificial layer. A lift-off process is performed to the metal-containing sacrificial layer so that the metal-containing sacrificial layer and the portion of the second insulation layer positioned above the metal-containing sacrificial layer are removed simultaneously. Following that, a second conductive layer is formed on the substrate, wherein the second conductive layer covers the surface of the semiconductor layer. Finally, the second conductive layer is patterned to form a source and a drain above the semiconductor layer.

It is an advantage of the present invention that the first conductive layer, first insulation layer, semiconductor layer, and metal-containing sacrificial layer are etched at the same time so that there is no semiconductor layer existing below most portions of data lines, which effectively avoids the occurrence of photo current and improves the quality of the thin-film transistor. Furthermore, according to the present invention, a metal-containing sacrificial layer is formed on the semiconductor layer before performing the lift-off process to the metal-containing sacrificial layer, thus the second insulation layer and the metal-containing sacrificial layer can be simultaneously removed. Accordingly, the quantity of utilized photomask can be reduced so as to effectively reduce process costs.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
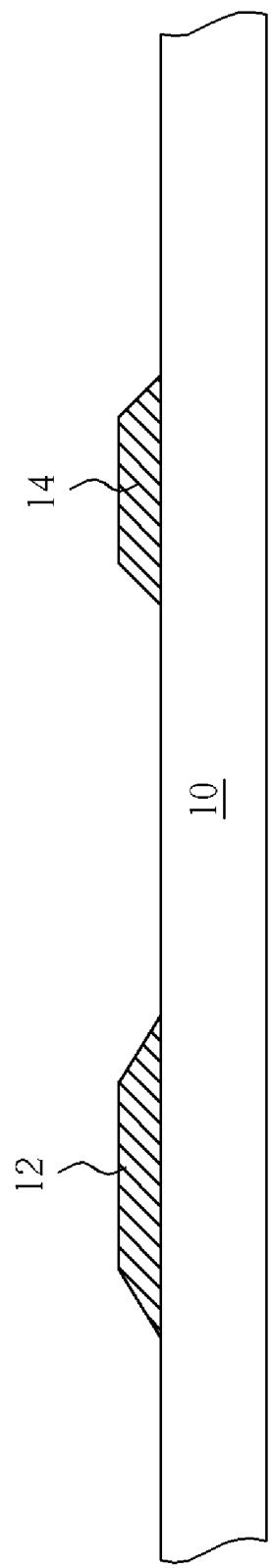
FIGS. 1-4 are schematic diagrams of the fabrication process of a thin-film transistor by using four photomasks according to the prior art.
Figure 2:
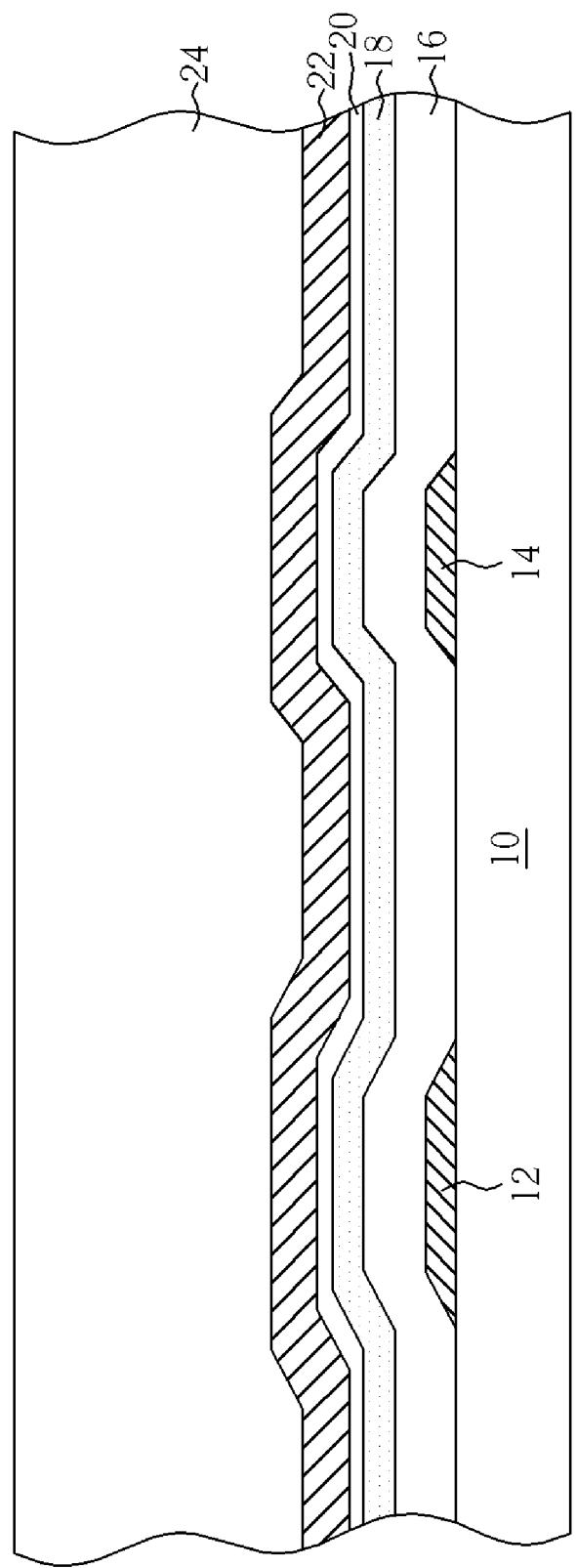
Figure 3:
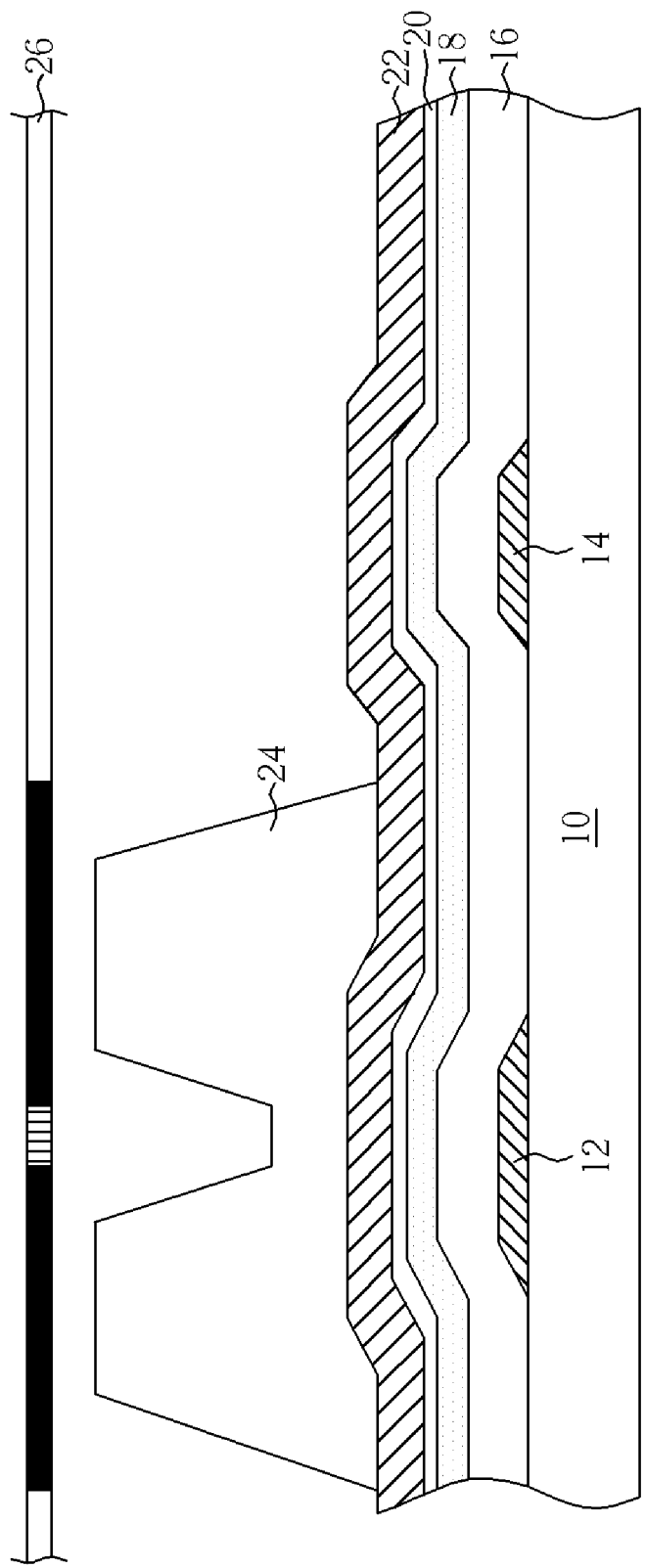
Figure 4:
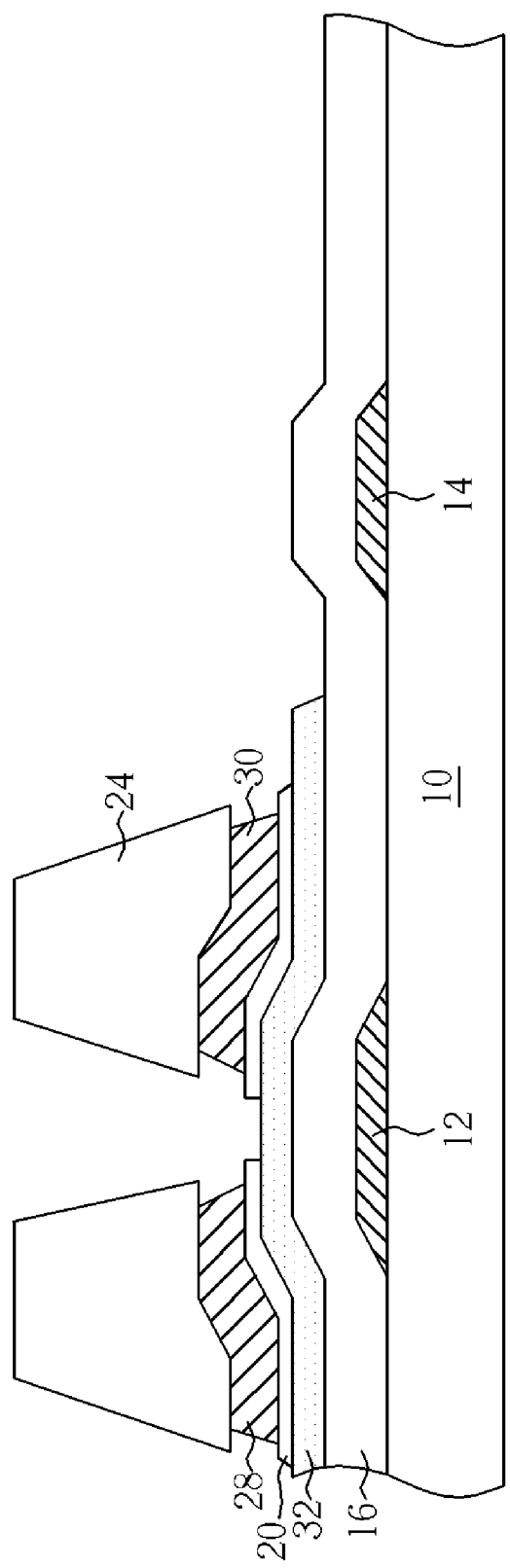
Figure 5:
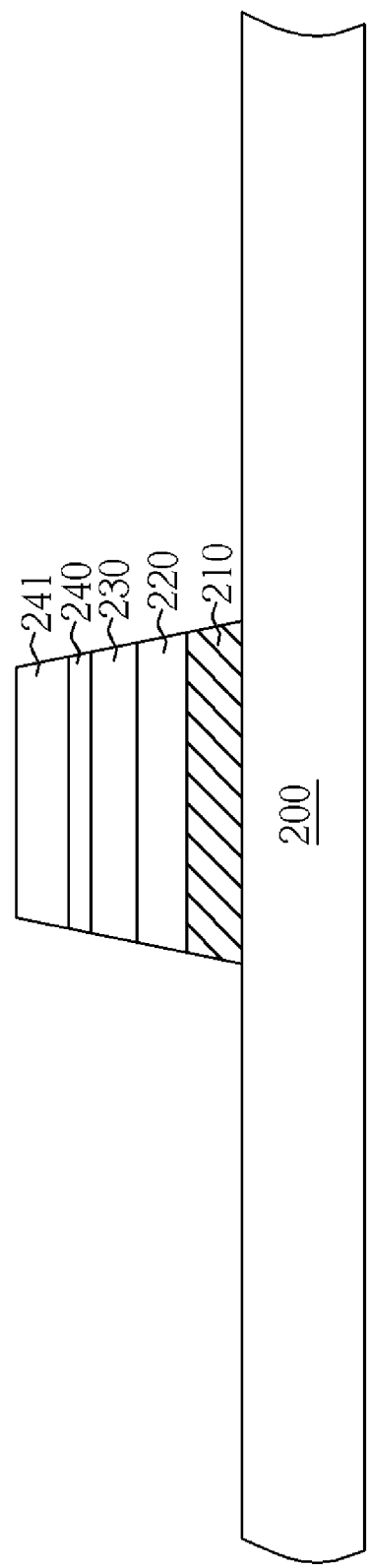
FIGS. 5-7 are schematic diagrams of the fabrication process of a thin-film transistor according to U.S. Pat. No. 6,998,640.
Figure 6:
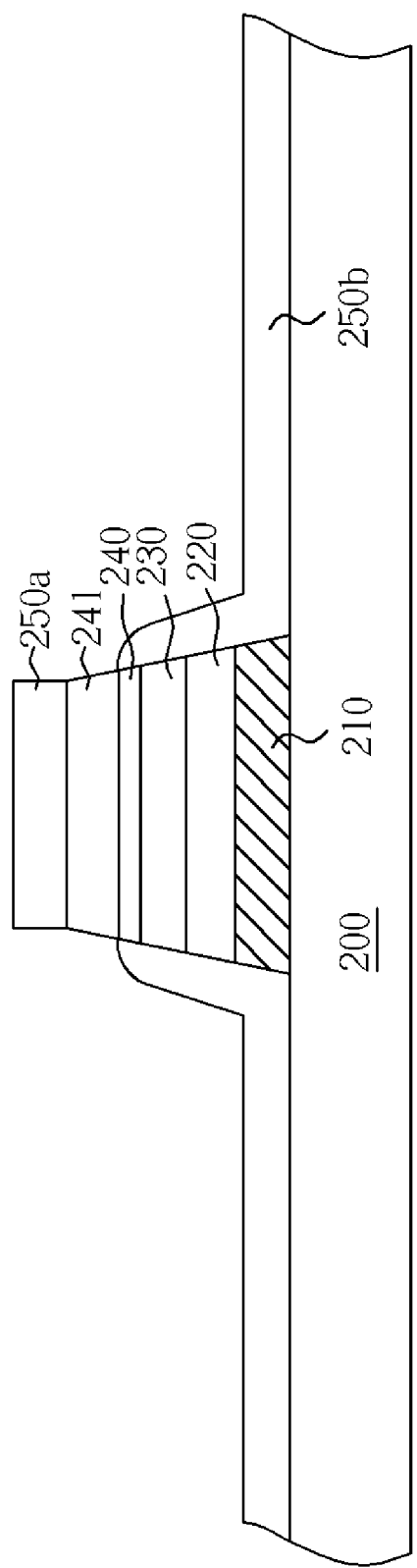
Figure 7:
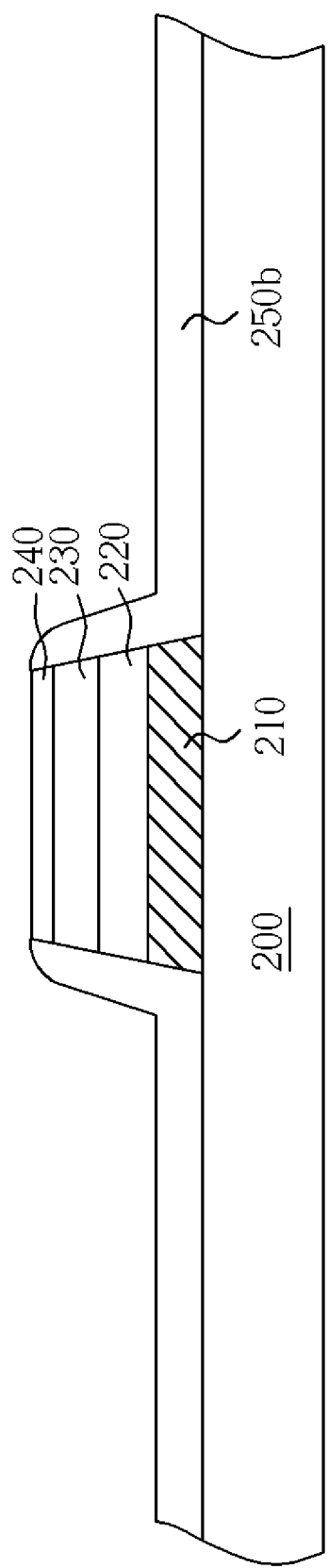
Figure 8:
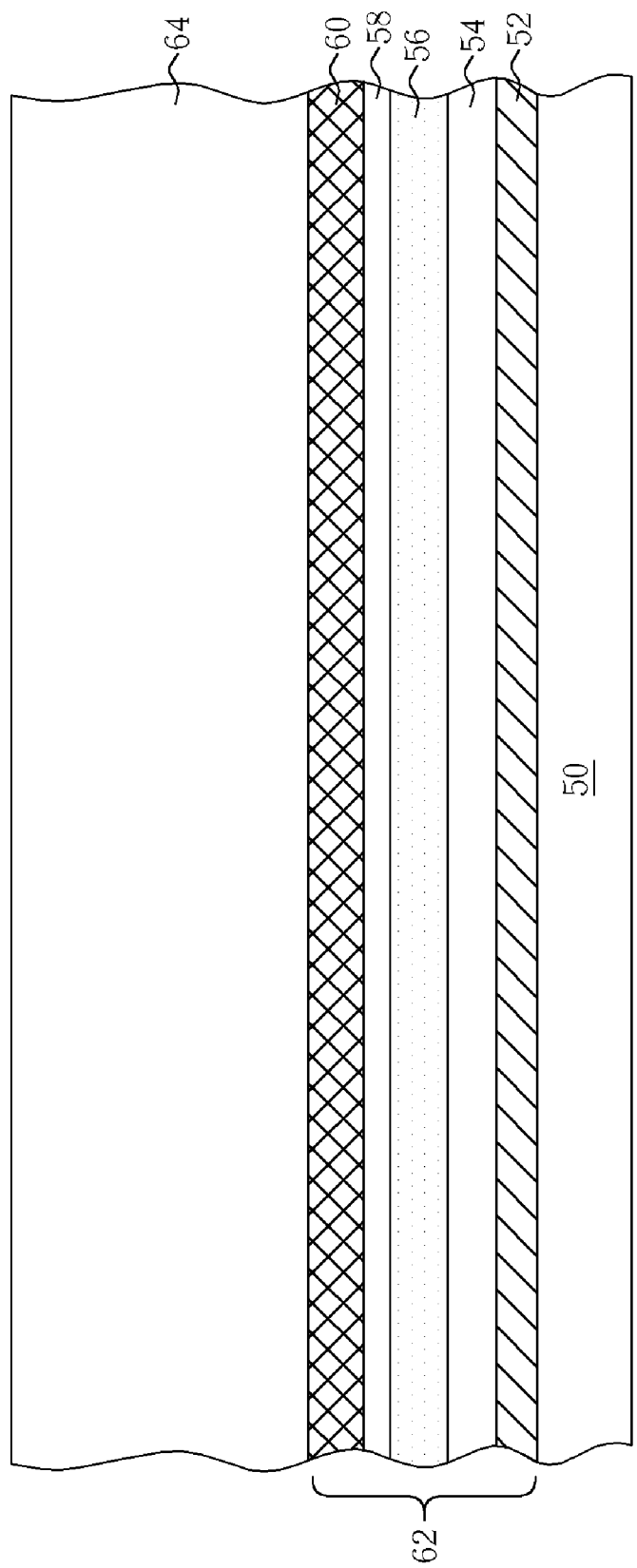
FIGS. 8-14 are schematic diagrams of the fabrication process of a thin-film transistor according to the present invention.

With reference to FIGS. 8-14, FIGS. 8-14 are schematic diagrams of the fabrication process of thin-film transistors according to the present invention. For the convenience of explanation, FIGS. 8-14 only show the fabrication process of a thin-film transistor. As shown in FIG. 8, first, a transparent substrate 50 is provided, wherein the transparent substrate 50 may be a glass substrate, a quartz substrate, or a plastic substrate. Then, four thin films 62 are successively formed on the surface of the transparent substrate 50, and the four thin films 62 comprise a first conductive layer 52, a first insulation layer 54, a semiconductor layer 56, and a metal-containing sacrificial layer 60. The material of the first conductive layer 52 may comprise aluminum (Al), molybdenum (Mo), chromium (Cr), tungsten (W), tantalum (Ta), copper (Cu), or an alloy of the above-mentioned metal materials. The first insulation layer 54 may be a silicon nitride layer or a silicon oxide layer, and the semiconductor layer 56 may be an amorphous silicon or micro-crystalline silicon layer. For improving the electric connection of the semiconductor layer 56 and the following formed source or drain, an N+ doped layer serving as an ohmic contact layer 58 may be formed on the surface of the semiconductor layer 56 before forming the metal-containing sacrificial layer 60, as shown in FIG. 8. In addition, the metal-containing sacrificial layer 60 may be a mono-layer, whose material comprises Mo, nickel (Ni), or Cr.

Figure 9:
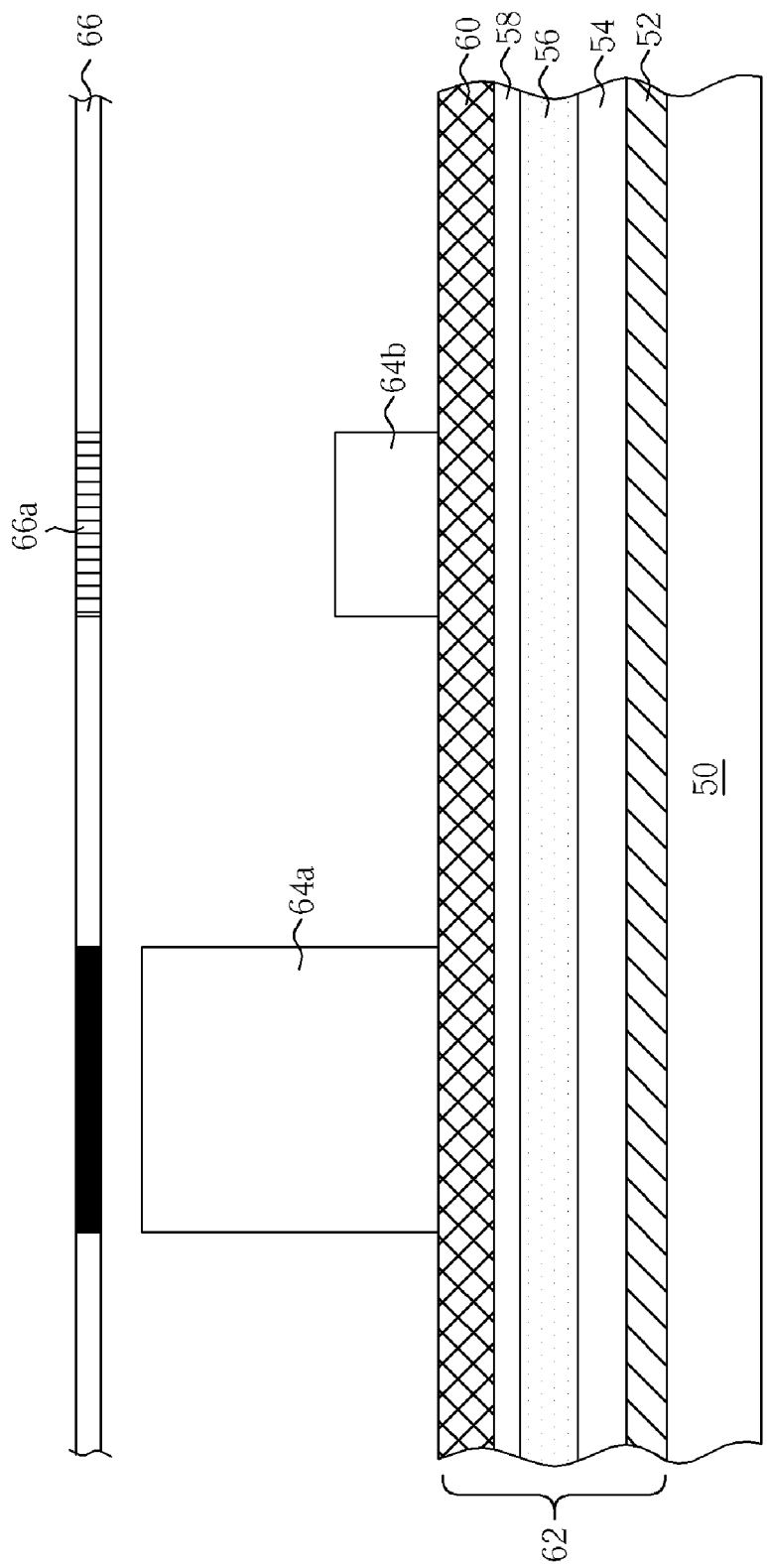
Figure 10:
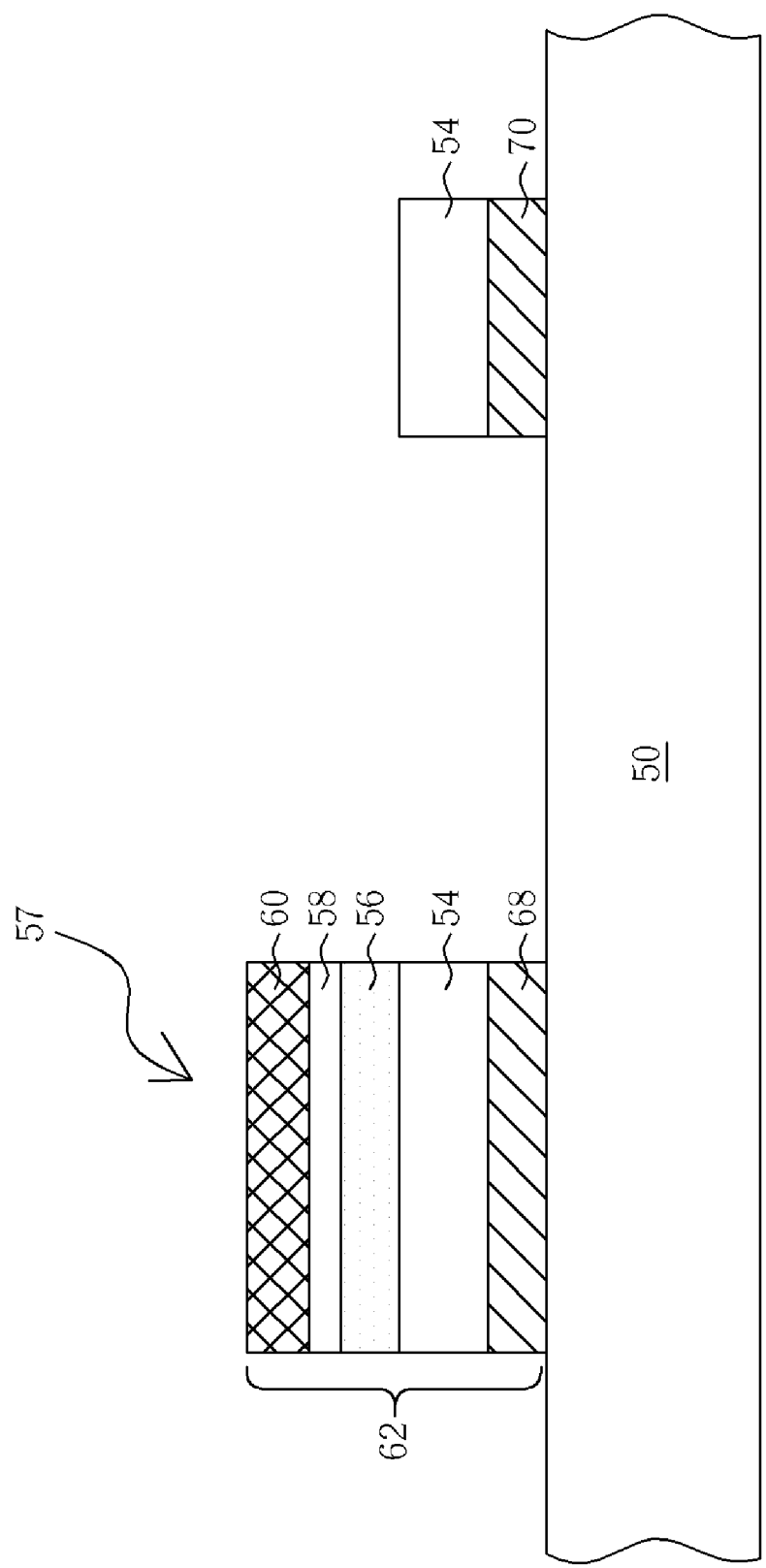

Referring to FIG. 9, a half-tone mask 66 is used for performing a first PEP to define a semiconductor island pattern 64a and a wire pattern 64b in the photoresist layer 64, wherein the half-tone region 66a of the half-tone mask 66 corresponds to the wire pattern 64b. Then, the patterned photoresist layer 64 is taken as an etching mask to perform an etching process to the four thin films 62 so that the semiconductor layer 56 becomes a semiconductor island 57 and the first conductive layer 52 becomes a gate electrode 68 and a wire structure 70 in a predetermined wire region, as shown in FIG. 10. The wire structure 70 may serve as the conducting wire structures of the display panel, such as a scanner line or as a capacitor in combination with other elements.

Figure 11:
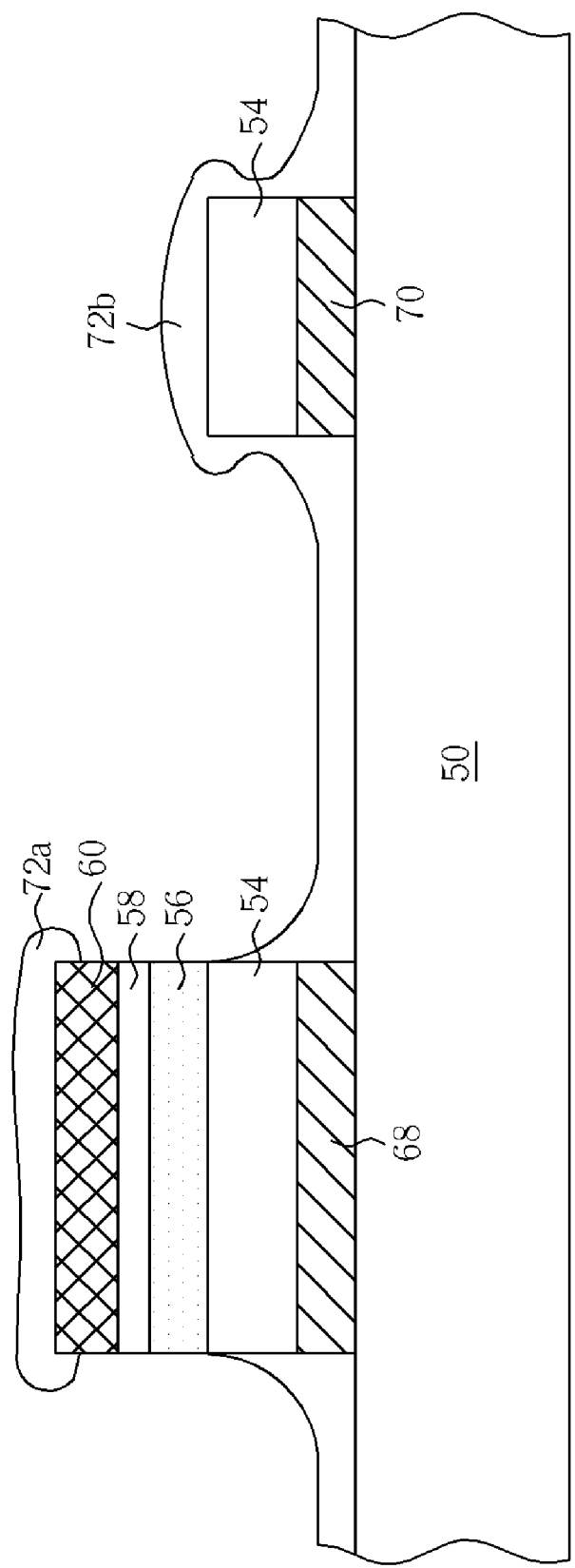
Figure 12:
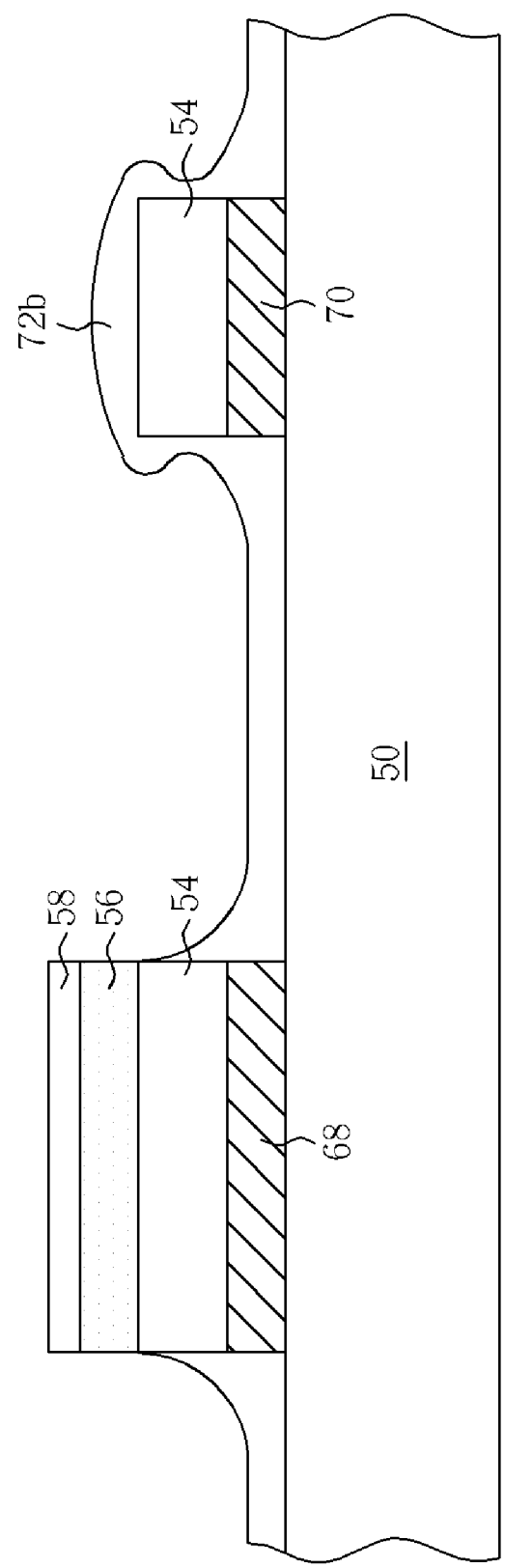

Thereafter, referring to FIG. 11, the photoresist layer 64 is removed. Then, a CVD process is performed to deposit a second insulation layer on the surface of the transparent substrate 50, wherein the numeral 72a indicates the portion of the second insulation layer above the metal-containing sacrificial layer 60, and the numeral 72b indicates the portion of the second insulation layer on the surface of the transparent substrate 50. It should be noted that the second insulation layer 72b had to completely cover the whole sidewall of the gate electrode 68 for protecting and preventing the gate electrode 68 from damage during the following lift-off process of the metal-containing sacrificial layer 60. Following that, a lift-off process to the metal-containing sacrificial layer 60 is performed. For instance, if the metal-containing sacrificial layer 60 comprises Mo, Aluminum acid may be used as a lift-off agent for the lift-off process, wherein the Aluminum acid may comprise phosphoric acid, nitric acid, and acetic acid, such that the metal-containing sacrificial layer 60 and the second insulation layer 72a thereon are simultaneously removed during the lift-off process, as shown in FIG. 12.

Figure 13:
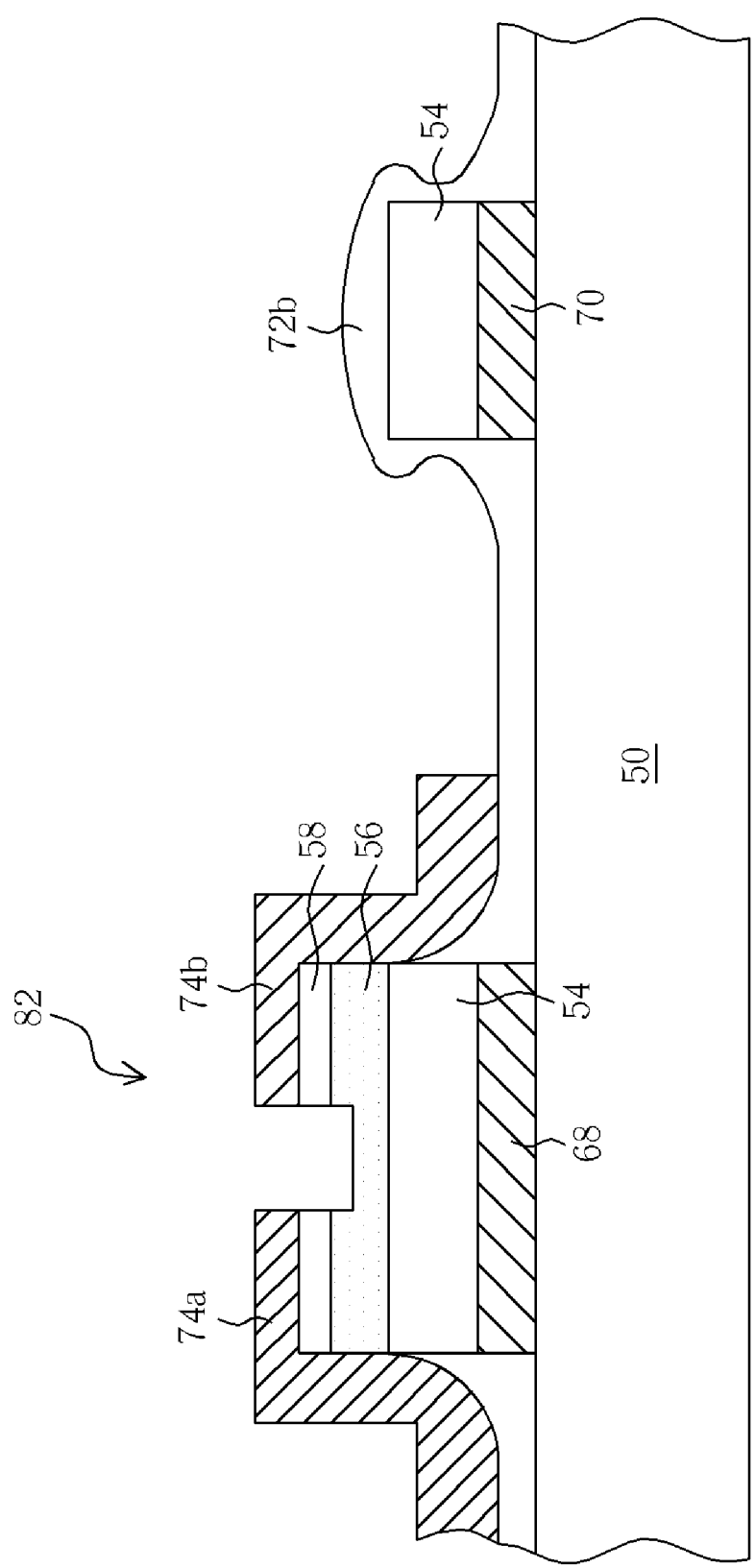

With reference to FIG. 13, a second conductive layer and a photoresist layer (not shown) are deposited on the transparent substrate 50. Then, a second PEP process is performed to define a source 74a, a drain 74b, and a channel pattern of the thin-film transistor in the second conductive layer. After removing the photoresist layer, the source 74a and drain 74b are taken as etching masks to perform an etching process to the ohmic contact layer 58 until the surface of the semiconductor layer 56 is exposed so as to complete the fabrication of the thin-film transistor 82.

Figure 14:
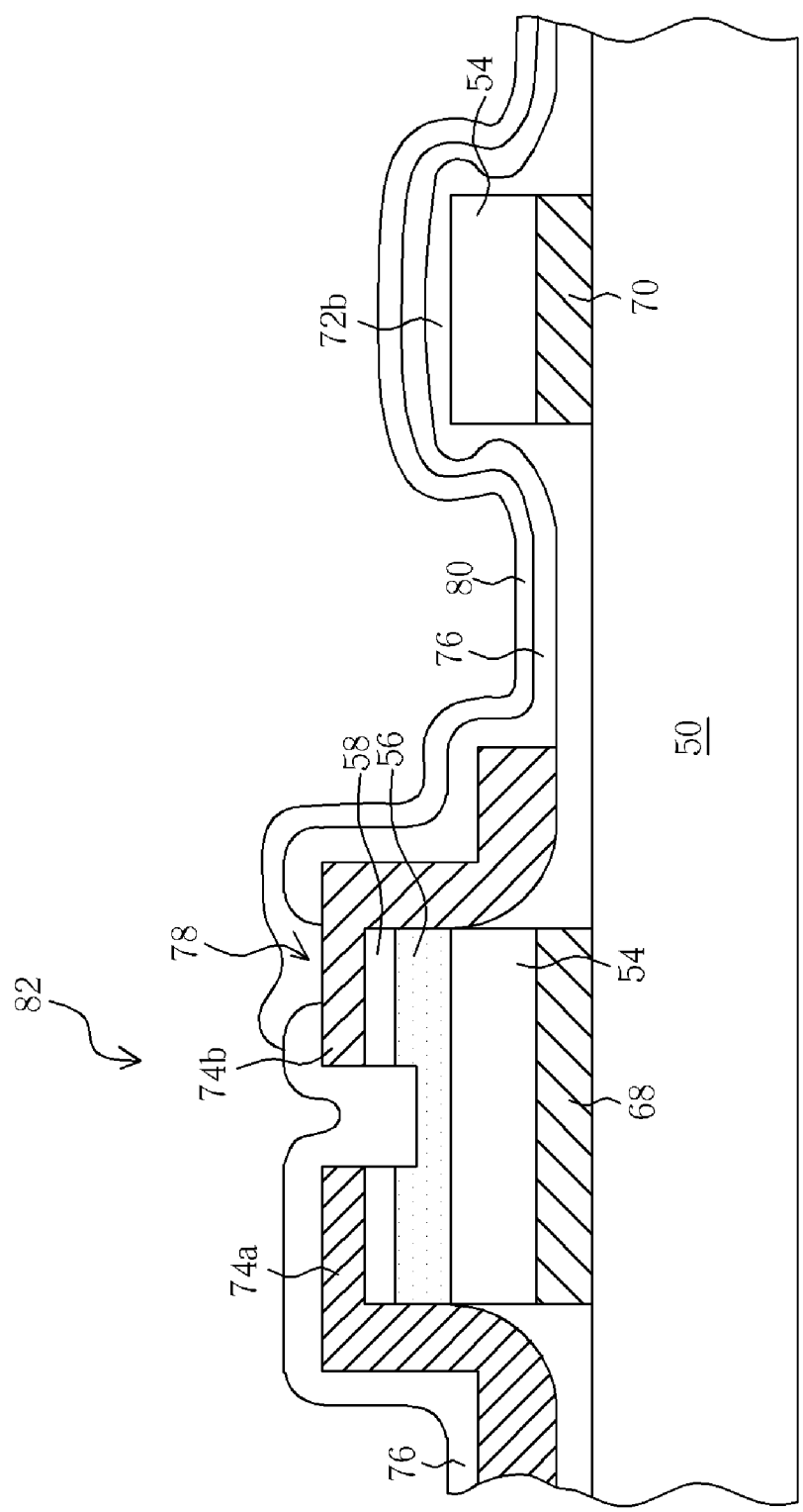

Referring to FIG. 14, a third insulation layer 76 is formed on the surface of the transparent substrate 50, which serves as a passivation layer. Thereafter, a third PEP is performed to form a contact hole 78 through the third insulation layer 76 above the drain 74b. Then, a transparent conductive layer (not shown) is formed on the transparent substrate 50, which is electrically connected to the drain 74b through the contact hole 78. A fourth PEP process is performed to form a pixel electrode 80 on the transparent substrate 50.

It should be noted that the material and structure of the metal-containing sacrificial layer of the present invention are not limited to those described in the above embodiment. In other embodiments of the present invention, the metal-containing sacrificial layer may be a multi-layer and formed with various metal materials. The metal-containing sacrificial layer may comprise a metal oxide film, such as indium tin oxide (ITO), indium zinc oxide (IZO), aluminum zinc oxide (AZO), gallium zinc oxide (GZO).

Figure 15:
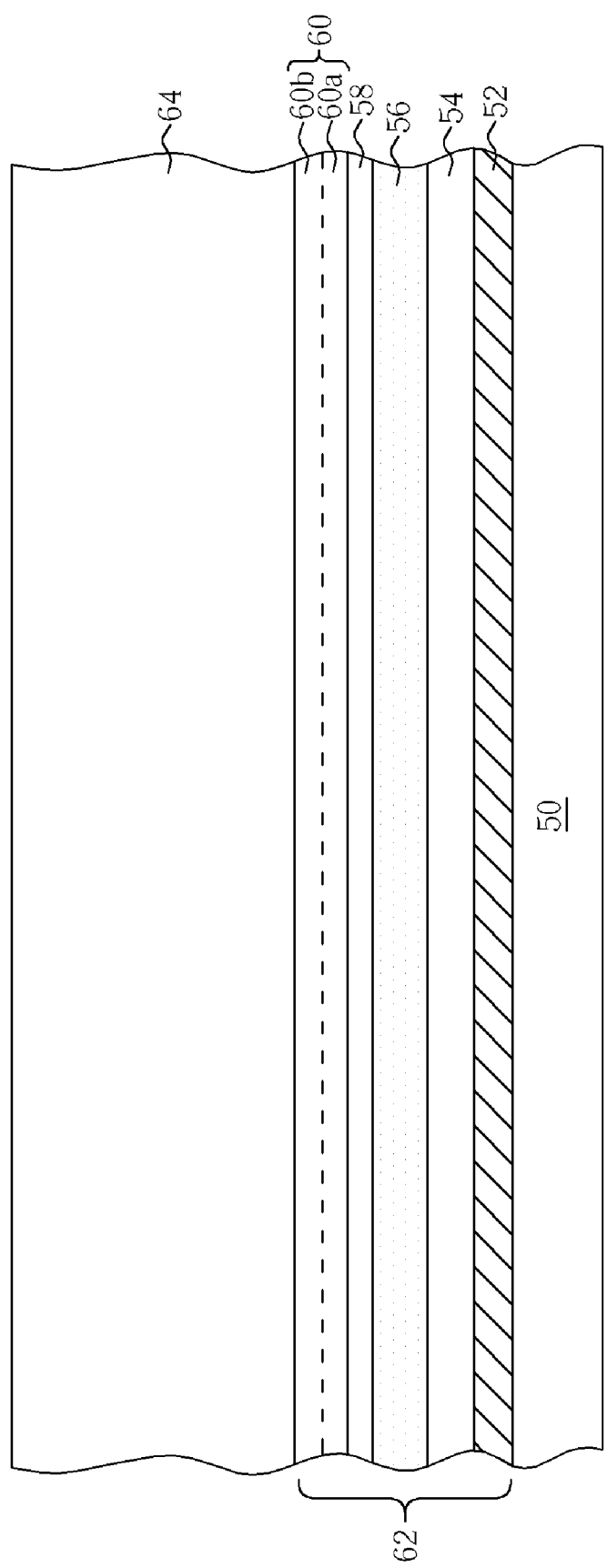
FIG. 15 is a schematic diagram of the fabrication process of a thin-film transistor according to another embodiment of the present invention.

With reference to FIG. 15, FIG. 15 is a schematic diagram of the fabrication process of thin-film transistors according to another embodiment of the present invention. In this embodiment, four thin films 62 or five thin films, comprising the first conductive layer 52, the first insulation layer 54, the semiconductor layer 56, the ohmic contact layer 58 and the metal-containing sacrificial layer 60, may be successively formed on the surface of the transparent substrate 50, wherein the metal-containing sacrificial layer 60 may be a multi-layer comprising a bottom sacrificial layer 60a and a top sacrificial layer 60b positioned on the bottom sacrificial layer 60a. The material of the bottom sacrificial layer 60a comprises Ti, Mo, Cr, Ni, or W, and the material of the top sacrificial layer 60b comprises Al. Thereafter, a first PEP process is performed to define a gate electrode, as the process in the first embodiment, and a second insulation layer (not shown) is deposited on the surface of the transparent substrate 50. Then, a lift-off process is performed to simultaneously remove the bottom sacrificial layer 60a, top sacrificial layer 60b, and the second insulation layer. Thereafter, following process for fabricating the thin-film transistor can be continuously performed.

In contrast to the prior art, the present invention method for fabricating thin-film transistors comprises forming a metal-containing sacrificial layer on the semiconductor layer before performing a lift-off process to the metal-containing sacrificial layer for simultaneously removing the second insulation layer with the metal-containing sacrificial layer, such that the quality of utilized photomask for the fabrication process can be reduced, which decreases the process costs. Furthermore, the present invention method provides a thin-film transistor structure that no semiconductor layer is positioned right below most portions of the data line so that photo current problems can be effectively avoided, resulted in a more stable quality of the thin-film transistors. In addition, according to the present invention, the half-tone region of a half-tone mask is used to define the wire structure, not the channel, and therefore it is not necessary to use a half-tone mask as precision as the prior-art half-tone mask for defining the channel pattern through its half-tone region. Moreover, even though a defect of pattern transference of the wire structure from the half-tone region occurs, its influence to the performance of the whole display panel is negligible. Accordingly, the present invention method effectively decreases the photomask cost and improves the quality of the thin-film transistor, and furthermore provides a liquid crystal display panel with preferable quality. In addition, the present invention method for fabrication thin-film transistors is not limited to liquid crystal display panels but may be applied to any display panels or devices with thin-film transistors, such as organic light emitting display, with the sprit of the present invention that is fabricating a thin-film transistor array with good quality through a small amount of photolithography processes and low process costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a thin film transistor, comprising:
   forming four thin films on a substrate successively, the four thin films comprise a first conductive layer, a first insulation layer, a semiconductor layer, and a metal-containing sacrificial layer from bottom to top;
   performing an etching process to pattern the four thin films simultaneously so as to form a gate electrode through the first conductive layer;
   forming a second insulation layer on the surfaces of the substrate and the metal-containing sacrificial layer;
   performing a lift-off process to the metal-containing sacrificial layer to remove the metal-containing sacrificial layer and a portion of the second insulation layer positioned above the metal-containing sacrificial layer simultaneously;
   forming a second conductive layer on the surface of the substrate, the second conductive layer covering the semiconductor layer; and
   patterning the second conductive layer so as to form a source and a drain on the semiconductor layer.

2. The method of claim 1, wherein the method further comprises forming an ohmic contact layer before forming the metal-containing sacrificial layer, the ohmic contact layer being positioned between the semiconductor layer and the metal-containing sacrificial layer, and the ohmic contact layer and the four thin films being formed on the substrate successively.

3. The method of claim 2, wherein the method further comprises patterning the ohmic contact layer after patterning the second conductive layer.

4. The method of claim 1, wherein the second insulation layer completely covers the sidewall of the gate electrode.

5. The method of claim 1, wherein the metal-containing sacrificial layer is a mono-layer and comprises molybdenum (Mo), nickel (Ni), or chromium (Cr).

6. The method of claim 5, wherein the lift-off process is performed by taking Aluminum acid as a lift-off agent when the material of the metal-containing sacrificial layer is molybdenum.

7. The method of claim 6, wherein the Aluminum acid comprises phosphoric acid, nitric acid, and acetic acid.

8. The method of claim 1, wherein the metal-containing sacrificial layer is a multi-layer which comprises a bottom sacrificial layer and a top sacrificial layer positioned on the bottom sacrificial layer.

9. The method of claim 8, wherein the material of the bottom sacrificial layer comprises titanium (Ti), Mo, Cr, Ni, or tungsten (W).

10. The method of claim 8, wherein the material of the top sacrificial layer comprises aluminum (Al).

11. The method of claim 1, wherein the second insulation layer is formed through a chemical vapor deposition (CVD) process.

12. The method of claim 1, wherein the etching process further forming a wire structure on a wire region of the substrate, and the wire structure comprises the first conductive layer.

13. The method of claim 12, wherein a half-tone mask is used for defining the pattern of the gate electrode and the wire structure before the etching process.

14. The method of claim 13, wherein a half-tone region of the half-tone mask corresponds to the wire structure.

15. The method of claim 1, wherein the material of the metal-containing sacrificial layer comprises indium tin oxide (ITO), indium zinc oxide, (IZO), aluminum zinc oxide (AZO) or gallium zinc oxide (GZO).

* * * * *